United States Patent
Chooi et al.

(10) Patent No.: US 6,683,002 B1
(45) Date of Patent: Jan. 27, 2004

(54) METHOD TO CREATE A COPPER DIFFUSION DETERRENT INTERFACE

(75) Inventors: Simon Chooi, Singapore (SG); Yakub Aliyu, Singapore (SG); Mei Sheng Zhou, Singapore (SG); John Leonard Sudijono, Singapore (SG); Subhash Gupta, Singapore (SG); Sudipto Ranendra Roy, Singapore (SG); Paul Kwok Keung Ho, Singapore (SG); Yi Xu, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 155 days.

(21) Appl. No.: 09/636,580

(22) Filed: Aug. 10, 2000

(51) Int. Cl.[7] .................. H01L 21/44; H01L 21/4763
(52) U.S. Cl. .................. 438/687; 438/622; 438/624; 438/637; 438/639; 438/666; 438/672
(58) Field of Search ................ 438/618, 622, 438/624, 634, 637, 639, 666, 672, 687; 257/758, 762, 767, 773, 774

(56) References Cited

U.S. PATENT DOCUMENTS

| | | | | |
|---|---|---|---|---|
| 5,451,542 A | | 9/1995 | Ashby ................. | 437/173 |
| 5,654,245 A | * | 8/1997 | Allen .................. | 438/629 |
| 5,693,563 A | | 12/1997 | Teong ................. | 437/190 |
| 5,863,834 A | | 1/1999 | Kawaguchi et al. ..... | 438/625 |
| 5,933,758 A | | 8/1999 | Jain ................... | 438/687 |
| 5,953,628 A | | 9/1999 | Kawaguchi ........... | 438/635 |
| 6,040,243 A | * | 3/2000 | Li et al. .............. | 438/687 |
| 6,335,570 B2 | * | 1/2002 | Mori et al. ........... | 257/751 |

FOREIGN PATENT DOCUMENTS

JP    10-22285    *    1/1998

* cited by examiner

*Primary Examiner*—Tom Thomas
*Assistant Examiner*—Hung Kim Vu
(74) *Attorney, Agent, or Firm*—George O. Saile; Rosemary L. S. Pike; Cheryl Figlin

(57) ABSTRACT

Method and product for forming a dual damascene interconnect structure, wherein depositing a copper sulfide interface layer as sidewalls to the opening deters migration or diffusing of copper ions into the dielectric material.

21 Claims, 8 Drawing Sheets

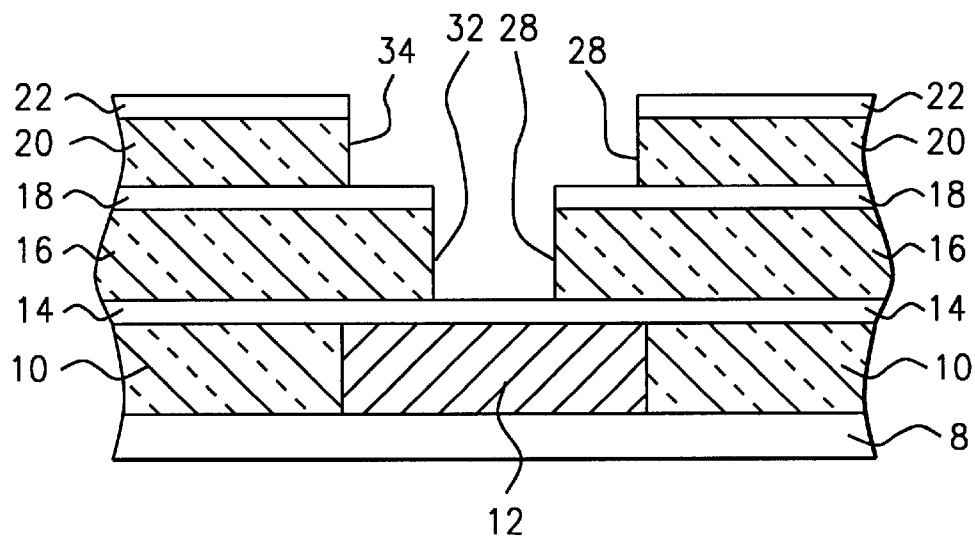
FIG. 1 - Prior Art
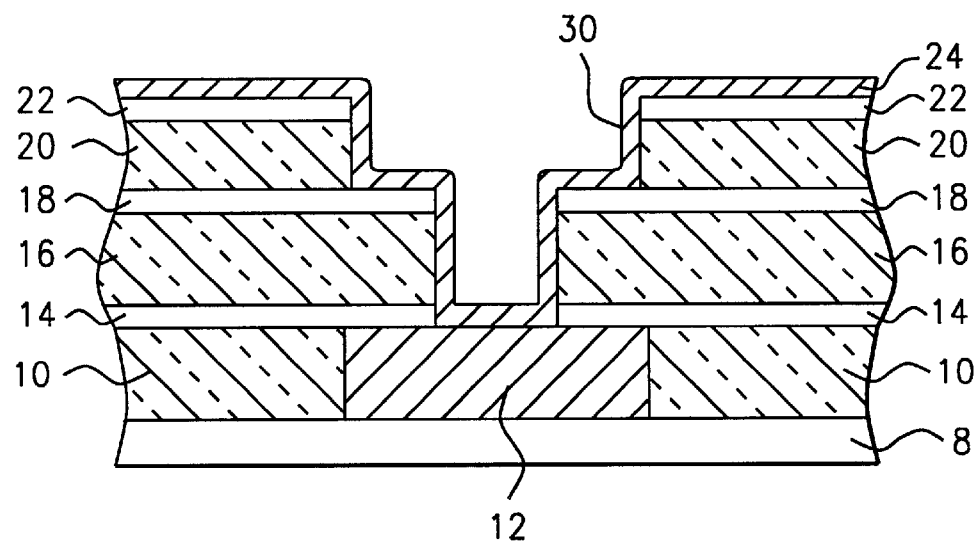
FIG. 2 - Prior Art

METHOD TO CREATE A COPPER DIFFUSION DETERRENT INTERFACE

BACKGROUND OF THE INVENTION

1. Field of Invention

The present invention relates generally to an improved ultra large-scale integrated (ULSI) circuit having a copper sulfide interface layer. More particularly, the present invention relates to the fabrication of ULSI using a dual damascene process in conjunction with using a copper sulfide interface layer.

2. Description of Prior Art

The dual damascene process, in which metal is buried inside patterned grooves in a substrate, is frequently used and has become one of the best methods for fabricating USLI circuits. Conventionally, metallic interconnects are formed by depositing a metallic layer over an insulating layer, for example, a silicon dioxide layer. Then, the insulating layer is etched to form a pattern of predefined conductive lines so that a vertical via hole can be formed between conductive layers. Thereafter, metallic material is deposited into the via hole to complete vertical connection between the conductive layers forming an interconnect. Conventionally, there can be a passivation layer formed between the two conductive layers. (See FIG. 1, 14)

Workers in the art are aware that when the passivation layer or any other layer that is positioned on the top of a lower interconnect 12 is etched away from the bottom of the via hole the sputtering of the copper onto the via hole side walls 28 usually occurs. Consequently, copper ions have migrated into the dielectric material, which would result in a change in device properties, and ultimately not being able to use the device. The current invention makes the use of a barrier layer optional thus saving a costly step in production of the devices. Others have striven to solve this problem by lining the via hole with barrier metal layers (See FIG. 2, 24). For Example, U.S. Pat. No. 5,933,758 (Jain) teaches a barrier layer over a dual damascene opening. U.S. Pat. No. 5,693,563 (Teong) shows dual barrier layers in a dual damascene process. U.S. Pat. No. 5,451,542 (Ashby) teaches an S surface passivation process. Even when the barrier layer is used there is still a second problem and that is that these barrier layers usually have thin holes throughout, so that when the copper is deposited in the via hole to form an upper interconnect. The copper diffuses into the dielectric materials, which again would result in a change in device properties, and ultimately not being able to use the device.

Other prior art have shown the use of copper sulfide as a layer. For example, U.S. Pat. Nos. 5,953,628 and 5,863,834 (Kawaguchi and Kawaguchi et al. respectively) teach the use of a copper sulfide on copper wiring. However, the use of copper sulfide is for preventing the oxidation of copper wiring, and it completely surrounds the copper wiring.

SUMMARY OF THE INVENTION

Accordingly, the present invention is to provide a method for forming a dual damascene interconnect structure, wherein migration or diffusing of copper ions into the dielectric material is deterred by depositing a copper sulfide interface layer. Moreover, another objective of the present invention is the cost savings of the barrier layer now being optional.

A method for forming a dual damascene opening by providing a semiconductor structure having a first dielectric layer and a lower interconnect, then forming a passivation layer over the first dielectric layer and forming a stack dielectric layer over the passivation layer. Then patterning and etching the stack dielectric layer to form an upper interconnect opening, and forming an interface layer over the passivation layer, on sidewalls of the upper interconnect opening and on top of the stack dielectric layer. Finally, patterning and etching the passivation layer to open the bottom of the upper interconnect opening and removing the passivation layer from the stack dielectric but not from the sidewalls of the upper interconnect opening.

In the alternative forming the interface layer after the etching and patterning of the passivation layer, and again leaving the interface layers on the sidewalls of the upper interconnect opening after removing some of the interface layer.

The product of a semiconductor structure having a first dielectric layer and a lower interconnect. A passivation layer over the first dielectric layer, and then a stack dielectric layer over the passivation layer. Finally, an upper interconnect opening through the stack dielectric layer and said passivation layer having sidewalls consisting of an interface layer.

BRIEF DESCRIPTION OF THE DRAWINGS

In the accompanying drawings forming a material part of this description there is shown:

FIG. 1 shows a cross-sectional view of a semiconductor of the prior art before etching away a passivation layer.

FIG. 2. shows a cross-sectional view of a semiconductor of the prior art having a barrier layer.

DETAILED DESCRIPTION OF THE INVENTION

The inventors discovered the problem that is shown in prior art FIGS. 1 and 2. This problem is solved by the present invention. FIGS. 1 and 2 are not to be considered prior art for the purposes of the patentability of this invention. The problem is the migration or diffusing of copper ions into the dielectric material in prior art FIG. 1, and the expense of producing prior art FIG. 2 with a barrier layer.

Figure 3A:
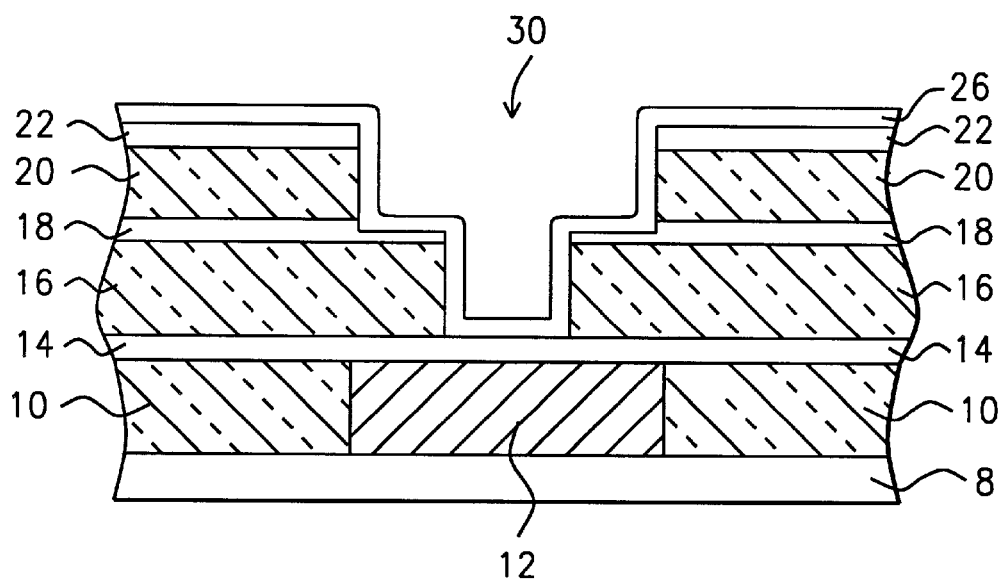
FIGS. 3A and 3B show a cross-sectional view of a semiconductor in progression of manufacturing wherein the interface layer is formed before etching away of a passivation layer according to a first embodiment of the present invention.

The preferred embodiment of the invention is now described. Referring now more particularly to FIG. 3A, a semiconductor structure 8 is provided. The semiconductor structure can be a wafer or a substrate including but not restricted to monocrystalline silicon, silicon-on-insulator (SOI) and silicon-on sapphire (SOS), with devices built therein and having overlying conductive and insulating layers. Then, a dielectric layer 10 having an interconnect 12 is formed over the substrate 8. The dielectric layer 10 (or insulating layer) includes but is not restricted to non-porous undoped silicon oxide, porous undoped silicon oxide, non-porous doped silicon oxide (dopants include phosphorus, boron, fluorine, nitrogen, carbon), porous doped silicon oxide, non-porous organic material, (e.g. SILK from Dow Chemical), porous organic materials, non-porous doped organic materials (dopants include fluorine, phosphorus, sulfer, carbon, and nitrogen) and porous doped organic materials. The dielectric layer 10 can be an inter-level dielectric (ILD) layer (e.g., formed on the wafer) or an inter metal dielectric (ID) layer (e.g., formed on a ILD layer or another IMD layer).

The lower interconnect 12 can be a contact to the wafer surface or device on the wafer or a higher level interconnect. The interconnect comprises one or more conductors from a group containing copper, aluminum, aluminum alloy, tungsten, titanium, titanium nitride, tantalum, tantalum nitride, tungsten nitride but is preferably comprised of copper and a barrier metal such as tantalum nitride. The interconnect can also be composed of polysilcon, a polycide or other materials. In the case of copper, although the interconnect 12 is shown to comprise a single layer (hence a single damascene interconnect), it should be understood that interconnect 12 can also be comprised of a dual damascene interconnect (not shown).

A passivation layer 14 is formed above dielectric layer 10 and interconnect 12. The passivation layer 14 includes but is not limited to silicon nitride (SiN), silicon oxynitride, silicon carbide, or boron nitride and is most preferably composed of SiN. The passivation layer 14 preferably has a thickness of between about 500 and 5000 Å.

Figure 5:
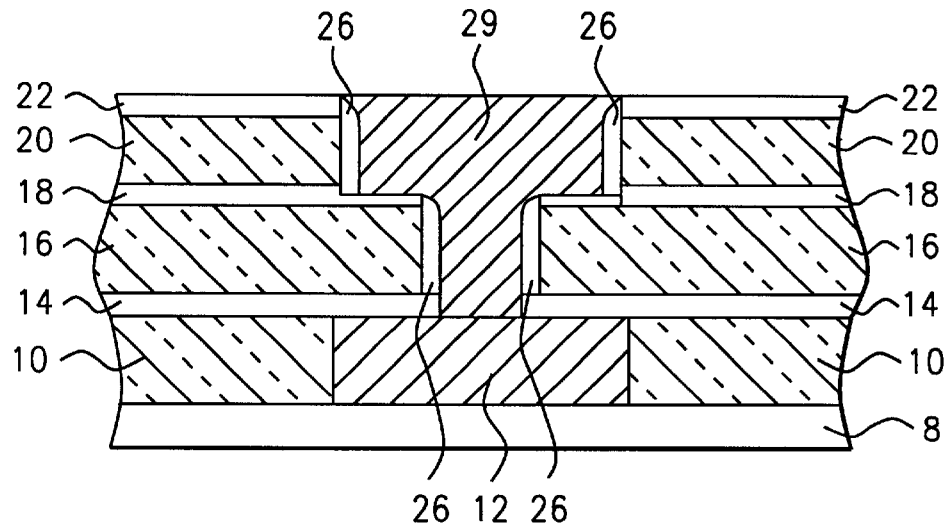
FIG. 5 is a cross-sectional view of a semiconductor of the present invention after partial removal of the interface layer.

Next, we form a dielectric layer (e.g., 16,20) over the passivation layer. The dielectric layer can be comprised of only one, or of several insulating layers and/or etch stop layers and/or cap layers. A preferred configuration is shown in FIG. 5. The materials for dielectric layers 16, and 20 are the same as described for dielectric layer 10, and can be deposited by spin coating followed by thermal treatment or by vapor deposition. Dielectric layer 16 preferably has a thickness of between about 2000 and 10,000 Å. An optional etch stop layer 18 is then formed on dielectric layer 16. The etch stop layer is preferably comprised of silicon nitride, silicon oxynitride, silicon carbide, or boron nitride and is most preferably comprised of silicon nitride. The etch stop layer 18 preferably has thickness of between about 500 and 5,000 Å. Next, another dielectric layer 20 (upper dielectric layer) is formed on etch stop layer 18. The dielectric layer 20 can be comprised of the same materials as dielectric layer 16. The dielectric layer 20 preferably has a thickness of between about 2,000 and 10,000 Å.

Finally, a cap layer 22, which is also optional, can be formed on dielectric layer 20. The cap layer is preferably composed of silicon nitride, silicon oxynitride, silicon carbide or boron nitride and most preferably silicon nitride. The cap layer preferably has a thickness of between about 500 and 5,000 Å.

Many methods can be used to form the interconnect opening or dual damascene opening including via-first, trench first, and self aligned via. The methods shown in this patent are not limiting and many other methods can be used. Also, the opening 30 can have any shape and is not limited to a dual damascene opening. For example, the opening 30 can be a conventional straight walled interconnect or line opening.

Figure 3B:
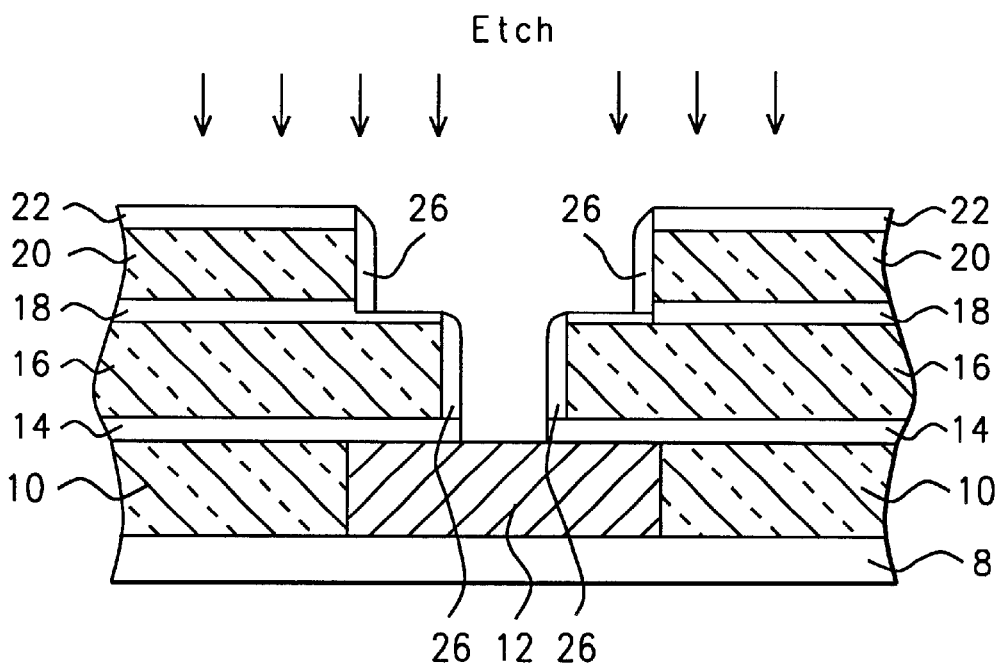
Figure 7A:
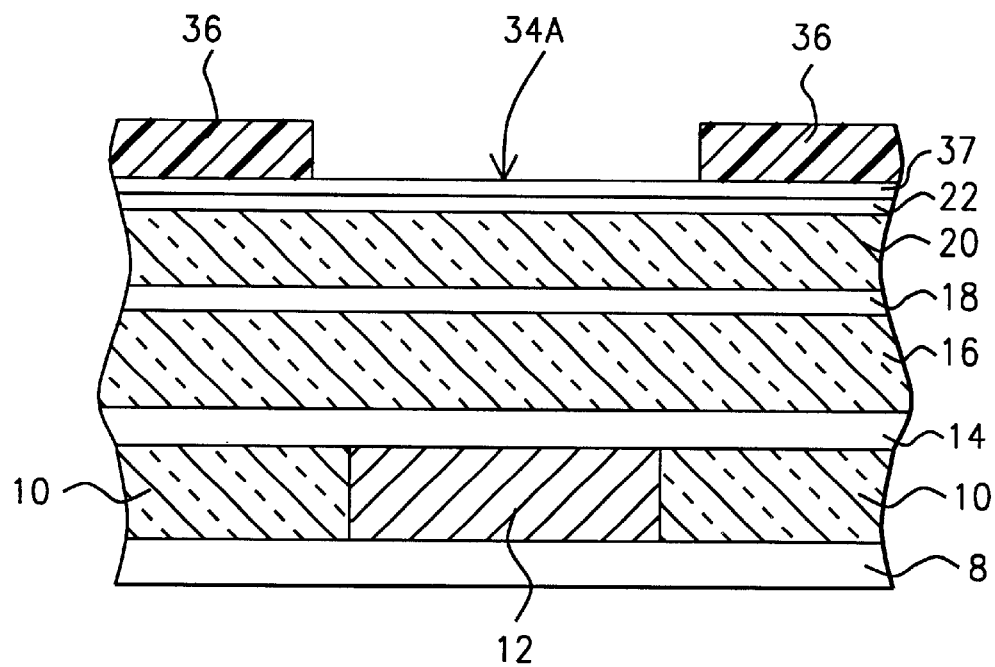
FIGS. 7A through B show a cross-sectional view of a semiconductor in progression of manufacturing steps in producing a dual damascene semiconductor according to the present invention.
Figure 7B:
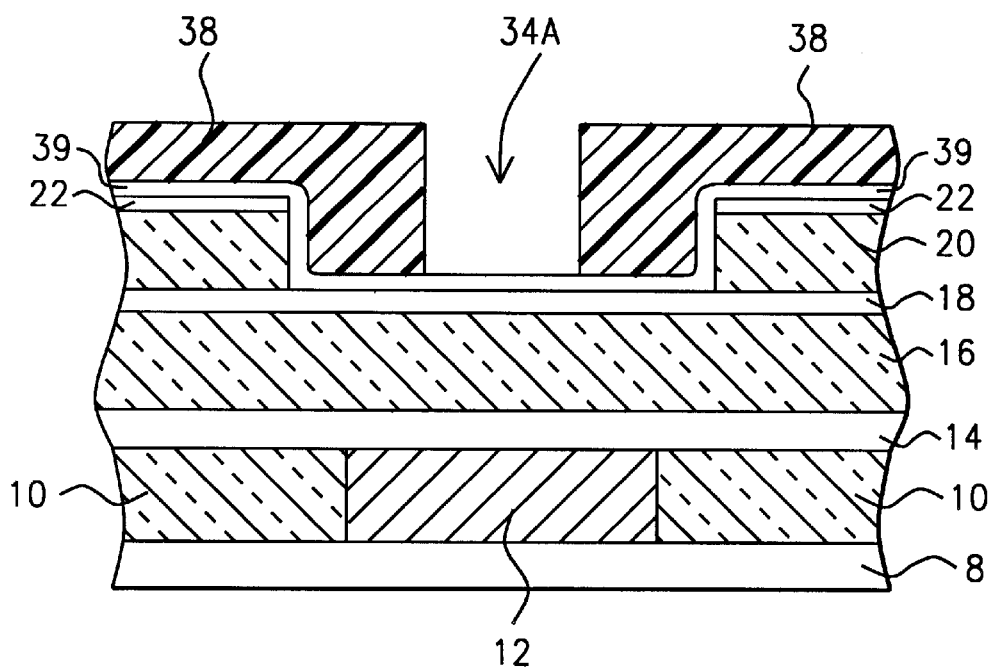

As shown in FIG. 1, the dual damascene opening 30 can be considered as comprised of 2 openings: a bottom via (trench) opening 32 and a top trench opening 34. The via openings can be formed in any order i.e. "via-first" approach. FIGS. 7A thru 7B show a first embodiment and FIGS. 8A and 3B show a $2^{nd}$ embodiment for forming the dual damascene opening.

Referring to FIGS. 7A and 7B, thereafter, a photo-resist layer 36, having a top trench resist opening 34A is formed over the optional organic bottom anti-reflective coating (BARC) layer 37, the BARC layer overlying the optional cap layer 22. Then, a conventional etching creates a first trench pattern 34. Photo resist layer 36 and the optional BARC layer 37 are removed.

As shown in FIG. 7B, another photo resist layer 38 with a bottom via (e.g. bottom trench) resist opening 32A is formed over an optional organic BARC layer 39. A bottom via opening 32 is formed in the dielectric layer 16 stopping on the passivation layer 14, as shown in FIG. 1.

Figure 8A:
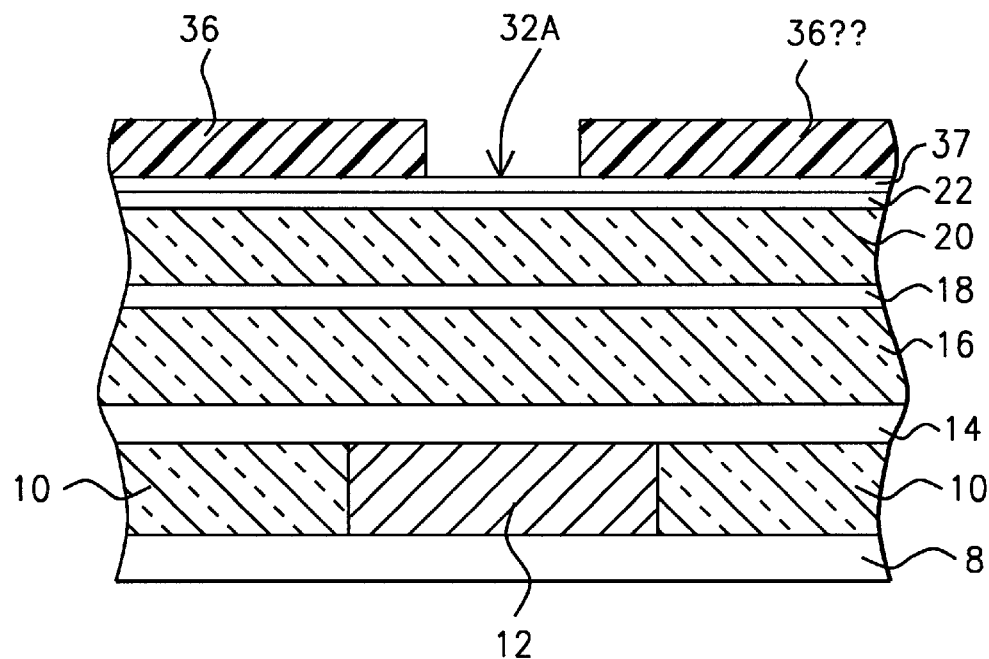
FIGS. 8A through B show a cross-sectional view of a semiconductor in progression of manufacturing steps of a second embodiment in producing a dual damascene semiconductor according to the present invention.

As shown in FIG. 8A a first photoresist layer 36 having a bottom via resist opening 32A is formed over the optional organic BARC layer 37. The optional BARC layer 37, cap layer 22, dielectric layers 20 and 16 and a partial etch of optional etch stop layer 18 are etched to form the bottom via opening 32. The removal of the photo resist and organic BARC layer then follow.

Figure 8B:
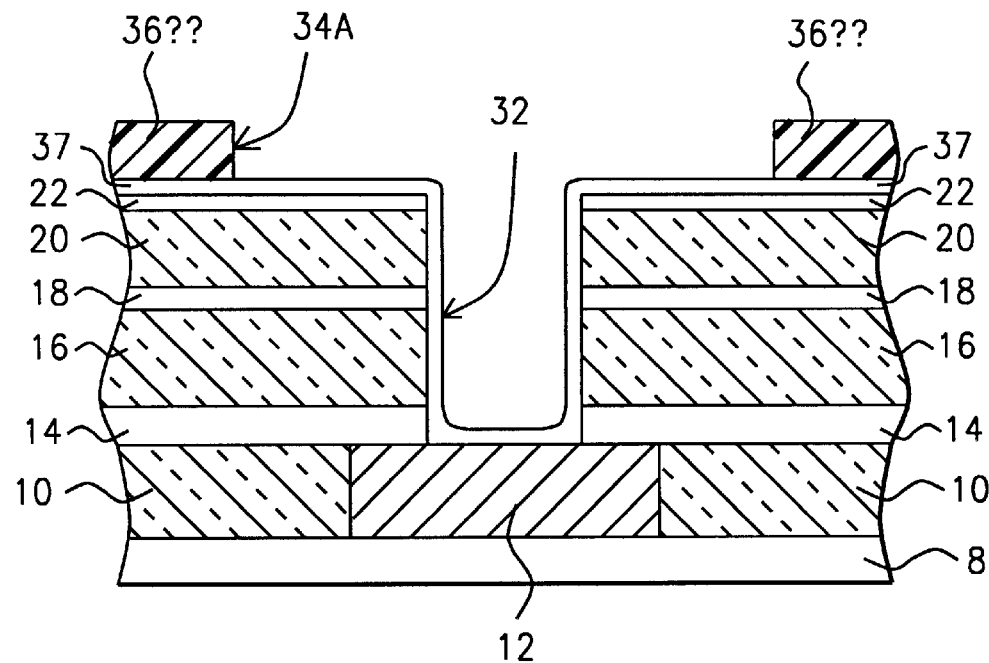

As shown in FIG. 8B a second photoresist layer 40 having a top via resist opening 34A is formed over an optional organic BARC layer 39 as shown. The top via opening 34 is etched in the optional cap layer 22 and dielectric layer 20, stopping on the optional etch stop layer 18.

The openings in the organic BARC layer, cap layer, etch-stop layer and dielectric layer are etched using plasma-assisted dry etching wherein the etching chemistry comprises one or more gases from a group containing fluorocarbon(s), fluorine-substituted hyelocarbon(s), fluorine, hydrocarbon(s), chlorine, chlorine-substituted hydrocarbon(s), fluorosulfer, oxygen, nitrogen, hydrogen, forming gas, carbon monoxide, argon and hydrogen bromide. Etching chemistry is tailored differently to each layer that is etched.

First Embodiment of the Invention

In the first embodiment of this invention, as shown in FIG. 3A, an interface layer 26 is formed in the finished vias made by either scenario of conventional etching, before the etch goes through passivation layer 14. The interface layer 26 includes copper (I) compounds or copper (II) compounds and is preferably copper sulfide.

Next, the interface layer 26 preferably comprised of copper sulfide is deposited over the exposed surfaces. CuS can be deposited through chemical vapor deposition by reacting a copper (I) complex that incorporates a Beta-diketonate ligand and a ligand L with a sulfide-containing compound:

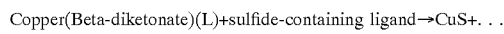

Copper(Beta-diketonate)(L)+sulfide-containing ligand→CuS+. . .

Figure 9A:
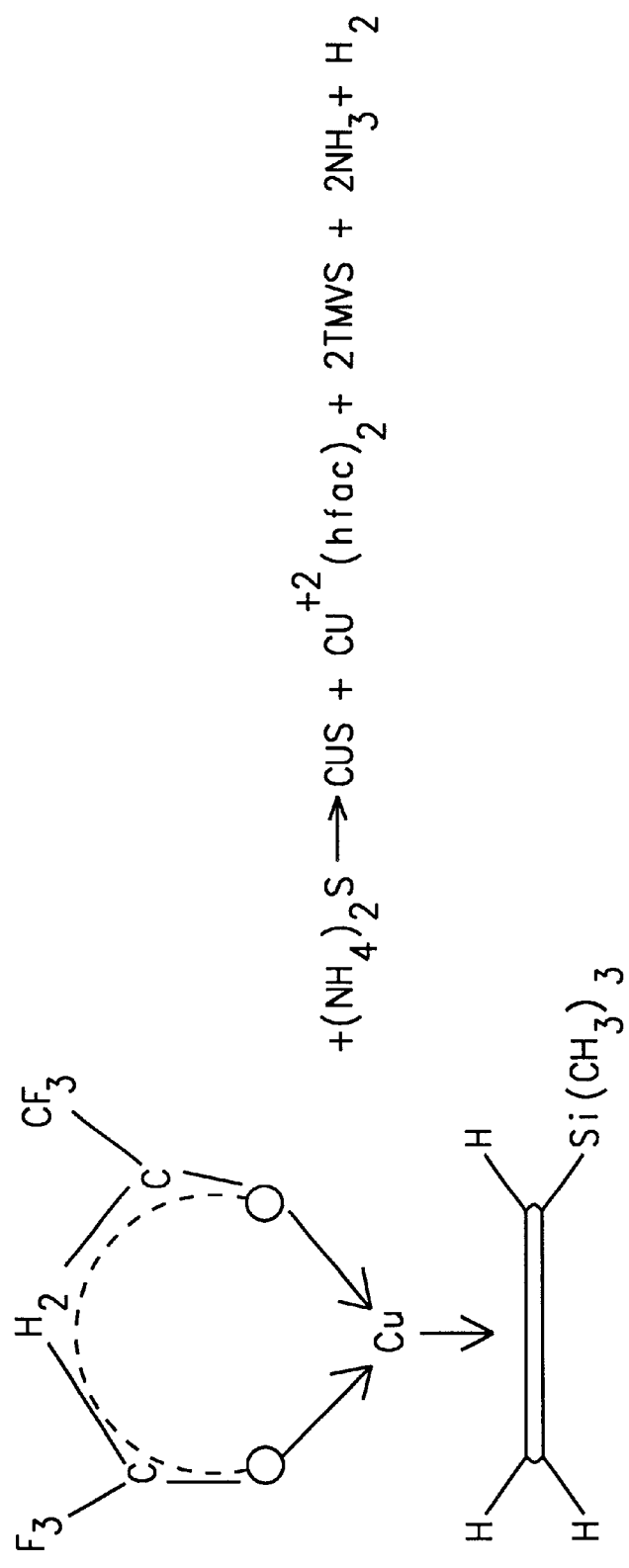
FIGS. 9A and 9B show the two chemical routes to the formation of copper sulfide.
Figure 9B:
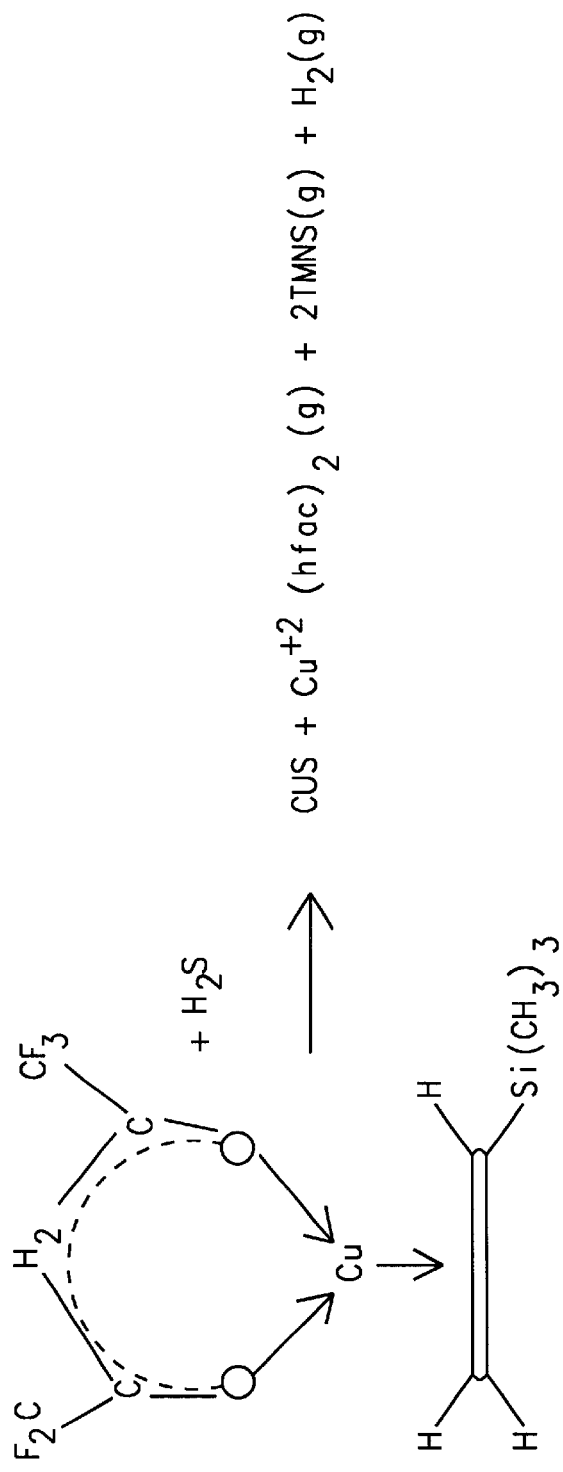

The Beta-diketonate in the copper (I) complex includes but is not limited to 1,1,1,5,5,5-hexafluoroacetylacetonate or hfac, acetylaetonate and trifluoroacetylacetonatle. The ligand L in the copper (I) complex includes but is not limited to an alkene, an alkyne and phosphina (e.g. trimethylphosphine). The sulfide containing compound is preferably ammonium sulfide or hydrogen sulfide. A commercially available copper (bet-adiketonate)(L) complex is (trimethylvinysilyl)hexafluoroacetylacetonale-copper (I), Cu (tmvs)(hfac) or better known as CupraSelect, manufactured by Schumacher Ltd. Cu (tmvs)(hfac) is a precursor for the CVD deposition of copper and upon reaction with a sulfide containing ligand as represented in FIG. 9B, forms copper sulfide. The interface layer preferably has a thickness of between about 50 and 5,000 Å.

Next, as shown in FIG. 3B, an etch of the interface layer 26 is followed by an etch of the passivation layers 14, to expose the lower interconnect 12. Preferably an anisotropic plasma-assisted dry etching is performed to form interface spacers 26 on the sidewalls of the dielectric layers. See FIG. 3B. The etching chemistry comprises one or more gases from a group containing chlorine, hydrogen bromide, ammonia, silicon tehachloride, chlorine-substituted silane, nitrogen, argon, hydrogen and oxygen. Upon the etching of the passivation layer 14, the copper from the exposed interconnect 12 that is sputtered onto the sidewalls of the via is thus prevented from diffusion into the dielectric layer by the interface spacers 26.

A chlorine-HBr chemistry or a chlorine-ammonia-silicon tetrachloride-nitrogen chemistry are preferably used to remove interface layer 26. The interface layer does remain on the sidewall 28 of the semiconductor as shown in FIG. 5. The chlorine-HBr chemistry that removes the interface layer 26 from the top of cap layer 22, layer 16 and the bottom of the via is performed.

The passivation layer 14 is preferably removed using a plasma-assisted dry etching wherein etching chemistry comprises one or more gases from a group containing fluorocarbon(s), fluorine-substituted hydrocarbon(s), fluorine, chlorine, carbon monoxide, nitrogen, and argon.

As shown in FIG. 5, an upper interconnect 29 is formed in the interconnect opening 30. The upper interconnect can be comprised of seed layers and metal conductor layers. A barrier metal layer becomes optional in the presence of the interface layer, and is preferred to be absent. The interconnect is formed of a metallic material is preferably copper or copper-aluminum alloy.

Second Embodiment of the Invention

Figure 4A:
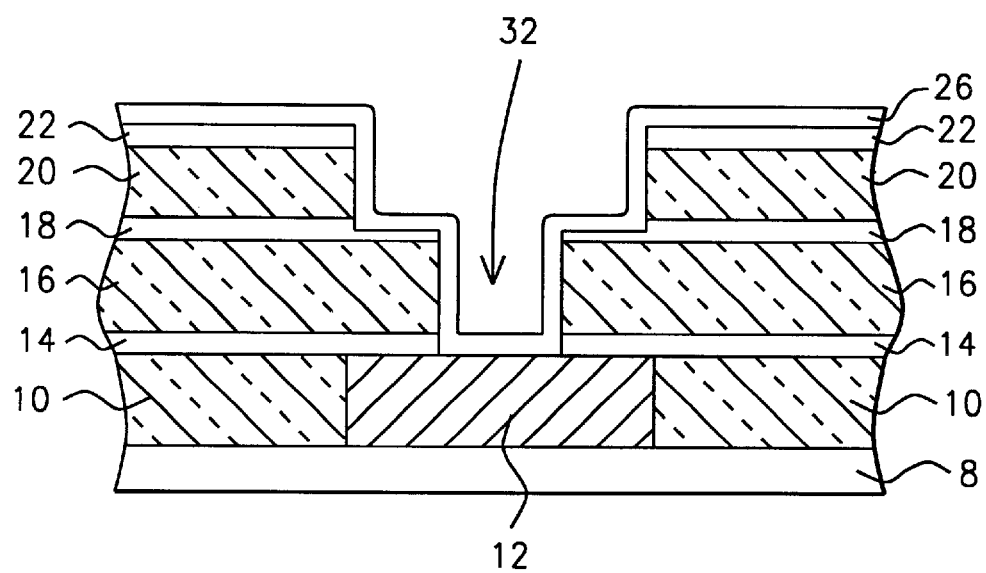
FIGS. 4A and 4B show a cross-sectional view of a semiconductor in progression of manufacturing wherein the interface layer is formed after etching away of a passivation layer according to a second embodiment of the present invention.
Figure 4B:
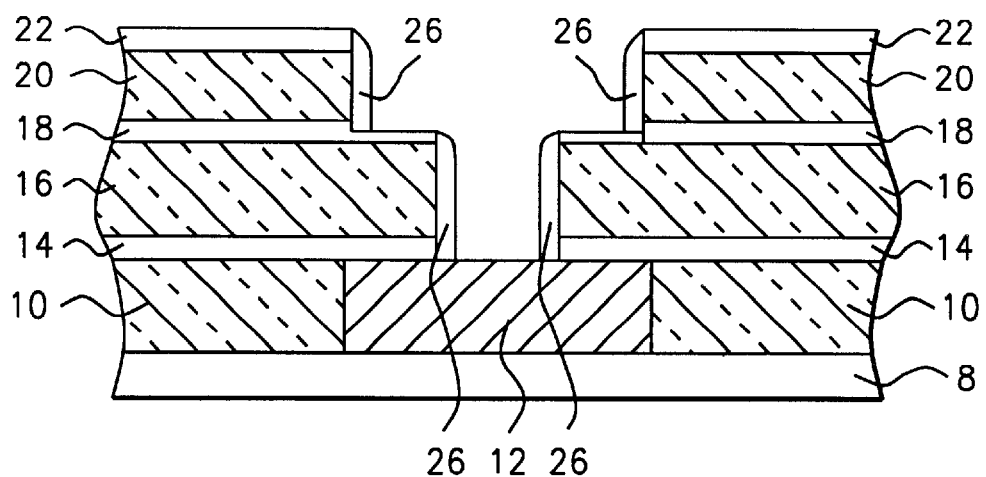

In a second embodiment of this invention, as seen in FIG. 4A, the interface layer 26 is formed in the finished trenches or vias 32, 34 made by either scenario of conventional etching, after the etch goes through passivation layer 14 (exposing the lower interconnect 12). The interface layer 26, as shown in FIG. 4B is formed over the surfaces, the upper interconnect 29 is then formed in the interconnect opening 30. Here the interface layer 26, deters the upper interconnect material from diffusing into the dielectric materials, and the barrier metal layer is no longer required. Whereupon the resistivity or sheet resistance of the interface layer 26 is undesirable, the interface layer at the bottom of the via in the dual damascene upper interconnect opening can, as an option, be removed by using the aforementioned plasma-assisted dry etching. The etching leaves the interface layer intact at the sidewall as interface layer spacers. Therefore the interface layer is removed from the dielectrics, and lower interconnect, but not from the sidewalls of the upper interconnect opening. Preferably, the upper interconnect is formed of a metallic material, preferably copper or copper aluminum alloy. In the case of copper, a seed layer is formed by vapor deposition followed by electroplating or electro less plating and finally chemical-mechanical polishing (CMP) completes the interconnect formation.

The invention's second embodiment interface layer (shown in FIGS. 4A and 4B) eliminates problems with the prior art's barrier layers. As the openings get higher aspect ratios (e.g., deeper and narrower openings), conventional barrier layer (e.g, TiN, TaN, Ti, etc.)deposited through physical vapor deposition, do not adequately cover the opening sidewalls. In contrast, the invention's CuS interface layer 26 deposited through chemical vapor deposition, adequately covers the sidewalls and prevents contamination from diffusing into the dielectric layers (ILD or IMD). With the invention's interface layer 26, no barrier layers are needed under the interconnect.

Figure 6:
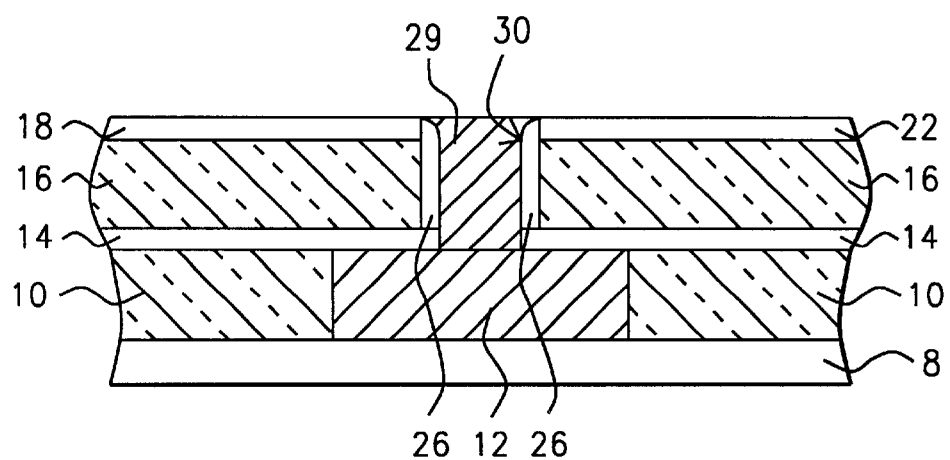
FIG. 6 is a cross-sectional view of a simplified structure with an interconnect.

FIG. 6 shows a simplified structure (e.g. single damascene) where the invention's interface layer 26 is formed over the sidewalls 28 of via hole 30. A conventional straight opening 30 is formed in the dielelctric layer. The invention's interface layer 26 still deters the diffusion of the sputtered copper on the via hole sidewalls 28 into the dielectric layer. Plug 29 is then formed in via hole 30.

While the invention has been particularly shown and described with reference to the preferred embodiments thereof, it will be understood by those skilled in the art that various changes in form, and details may be made without departing from the spirit and scope of the invention.

What is claimed is:

1. A method for forming an interconnect opening comprising:
   providing a semiconductor structure having a first dielectric layer and a lower interconnect;
   forming a passivation layer over said first dielectric layer and said interconnect;
   forming a stack dielectric layer over said passivation layer;
   patterning and etching said stack dielectric layer to form an upper interconnect opening;
   forming an interface layer of either a copper (I) compound or a copper (II) compound over the passivation layer, on side sidewalls said upper interconnect opening and on top of said stack dielectric layer;
   said interface layer is formed by a reaction comprising: reacting complex with a sulfide-containing compound,
   removing said interface layer from the stack dielectric but not from the sidewalls of said upper interconnect opening:
   etching the passivation layer and interface layer to open the bottom of the upper interconnect opening.

2. The method of claim 1, wherein said stack dielectric layer consists of one dielectric layer.

3. The method of claim 1, wherein said stack dielectric layer is comprised of a second dielectric layer and a third dielectric layer.

4. The method of claim 3, wherein an etch stop layer is formed between the second and third dielectric layers.

5. The method of claim 1, wherein the method is for forming a dual damascene opening.

6. The method of claim 1, wherein a metal is deposited in the upper interconnect opening to form an upper interconnect.

7. The method of claim 1, wherein a cap layer is formed on the stack dielectric layers.

8. The method of claim 1, wherein the interface layer is a copper sulfide interface layer.

9. The method of claim 8, wherein copper sulfide is be deposited through chemical vapor deposition.

10. The method of claim 1, wherein the interface layer is deposited by using a chemical vapor deposition.

11. The method of claim 1 wherein L in the complex comprises one of the following: an alkene, an alkyne or a phosphine.

12. The method of claim 1 wherein the sulfide-containing compound comprises either ammonium sulfide or hydrogen sulfide.

13. The method of claim 1, wherein the interface layer is removed partially by plasma-assisted dry etching wherein etching chemistry comprises one or more gases from a group containing hydrogen bromide, chlorine, ammonia, silicon tetrachloride, chlorine-substituted silane, nitrogen, argon and hydrogen.

14. The method of claim 1, wherein the lower interconnect is comprised of one or more conductors from a group containing copper, aluminum, aluminum alloy, tungsten, titanium, titanium nitride, tantalum, tantalum nitride and tungsten nitride.

15. The method of claim 1, wherein the lower interconnect is comprised of copper.

16. The method of claim 1, wherein the dielectric layers are one of the following:
  a. non-porous undoped silicon oxide,
  b. porous undoped silicon oxide
  c. non-porous doped silicon oxide,
  d. porous doped silicon oxide,
  e. non-porous organic material, porous organic material,
  f. non-porous doped organic materials,
  g. porous doped organic material,
  h. phosphosicate glass, or
  i. SiO2.

17. The method of claim 1, wherein the passivation layer is one of the following;
  a. silicon nitride,
  b. silicon oxynitride,
  c. silicon carbide, or
  d. boron nitride.

18. A method for forming an interconnect opening comprising:
  providing a semiconductor structure having a first dielectric layer and a lower interconnect;
  forming a passivation layer over said first dielectric layer and said interconnect;
  forming a stack dielectric layer over said passivation layer;
  patterning and etching said stack dielectric layer to form an upper interconnect opening;
  etching of said passivation layer to open a bottom of the upper interconnect opening;
  forming an interface layer of either a copper (I) compound or a copper (II) compound over the lower interconnect, on sidewalls of said upper interconnect opening and on top of said stack dielectric layer:
    said interface layer is formed by a reaction comprising: reacting complex with a sulfide-containing compound.

19. The method of claim 18, wherein said interface layer is removed from the stack dielectric, and from the lower interconnect, but not from the sidewalls of said upper interconnect opening.

20. A method for forming an interconnect opening comprising:
  providing a semiconductor structure having a first dielectric layer and a lower interconnect;
  forming a passivation layer over said first dielectric layer and said interconnect;
  forming a stack dielectric layer over said passivation layer;
  patterning and etching said stack dielectric layer to form an upper interconnect opening;
  forming an interface layer over the passivation layer, on sidewalls said upper interconnect opening and on top of said stack dielectric layer wherein the interface layer is formed by a reaction comprising: reacting complex with a sulfide-containing compound; wherein L in the complex comprises one of the following: an alkene, an alkyne or a phosphine;
  removing said interface layer from the stack dielectric but not from the sidewalls of said upper interconnect opening:
    etching the passivation layer and interface layer to open the bottom of the upper interconnect opening.

21. The method of claim 20, wherein copper sulfide is be deposited through chemical vapor deposition.

* * * * *